May 17, 1966 D. J. CARLSON 3,252,095

MULTIBAND TUNABLE CIRCUIT

Filed Dec. 4, 1962 2 Sheets-Sheet 1

INVENTOR.

DAVID J. CARLSON

BY [signature]

ATTORNEY

INVENTOR.
DAVID J. CARLSON
BY
Eugene M. Whitacre
ATTORNEY 3,252,095

MULTIBAND TUNABLE CIRCUIT

David J. Carlson, Princeton, N.J., assignor to Radio Corporation of America, a corporation of Delaware Filed Dec. 4, 1962, Ser. No. 242,121
16 Claims. (Cl. 325—459)

This invention relates in general to tunable circuits, and more particularly to multiband tuners operable over a wide range of frequency such as for example the ultra-high frequency (UHF) and the very-high frequency (VHF) television frequency bands.

The Federal Communications Commission has allocated 82 channels for the transmission of television signals in the VHF and UHF frequency bands extending roughly from 50 megacycles to 900 megacycles (mc.). In television receivers capable of receiving any one of the 82 channels, it has heretofore been the practice to provide separate UHF and VHF tuners. A tuning system including two such tuners is not only complicated and expensive in the sense that there are two separate chassis and mounting means therefor, but in addition, the problem of providing a simple and foolproof tuning control and indicating system is made difficult because of the electrical power and signal switching required and the fact that the two separate tuning shafts must be controlled.

Accordingly, it is an object of this invention to provide a single unit television tuner for receiving any one of the television channels in both the VHF and UHF television bands.

It is another object of this invention to provide a UHF-VHF television band tuner employing a common tuning control element.

It is still a further object of this invention to provide an all-channel television tuner in which UHF and VHF input signals may be coupled simultaneously to the tuner input circuit means without switching between the sources of such signals.

In accordance with the present invention, a multiband tunable circuit may be tuned at a desired frequency by a single tuning control element such as a variable capacitor. The tunable circuit includes a transmission line, such as a concentric line end loaded by the variable capacitor to tune the transmission line over a first frequency band. At least one conductor of the transmission line is formed in two separate sections, which, for tuning over said first frequency band, are connected together by suitable switching means. For tuning over a second lower frequency band the switching means is actuated to break the connection between said transmission line conductor sections and to connect an inductor of suitable inductance value to the variable capacitor. Additional frequency bands may be tuned by providing additional inductors of suitable values which may be selectively connected to said variable capacitor by said switching means. If desired, one of the separate sections of the transmission line may be used to complete the circuit of the inductor to the variable capacitor when the tunable circuit is set for operation in the second frequency band.

The multiband tuning circuit described has particular application in an all-channel television tuner as the signal selection and oscillator tuning circuits thereof. In a tuner of this type a common radio frequency (R.F.) amplifier may be used to amplify both VHF and UHF signals. The input and output circuits of the R.F. amplifier may comprise multiband tuning circuits as described above. In accordance with a feature of the invention, neutralization of the R.F. amplifier is provided over both the VHF and UHF television bands without requiring complicated circuitry or additional switching means.

In accordance with another feature of the invention, the energy necessary for causing oscillations in the oscillator circuit is fed back through the intrinsic capacitance of the active element of the oscillator when operating at UHF and through an added capacitor coupled between the output and input circuits of the active element when operating at VHF.

Still another feature of the invention comprises a UHF-VHF tuner to which UHF and VHF input signals from separate sources may be applied simultaneously without the necessity of switching between the signal sources to obtain the desired operation.

The novel features that are considered to be characteristic of this invention are set forth with particularity in the appended claims. The invention itself, however, will be best understood from the following description when read in conjunction with the accompanying drawings, in which:

Figure 1:
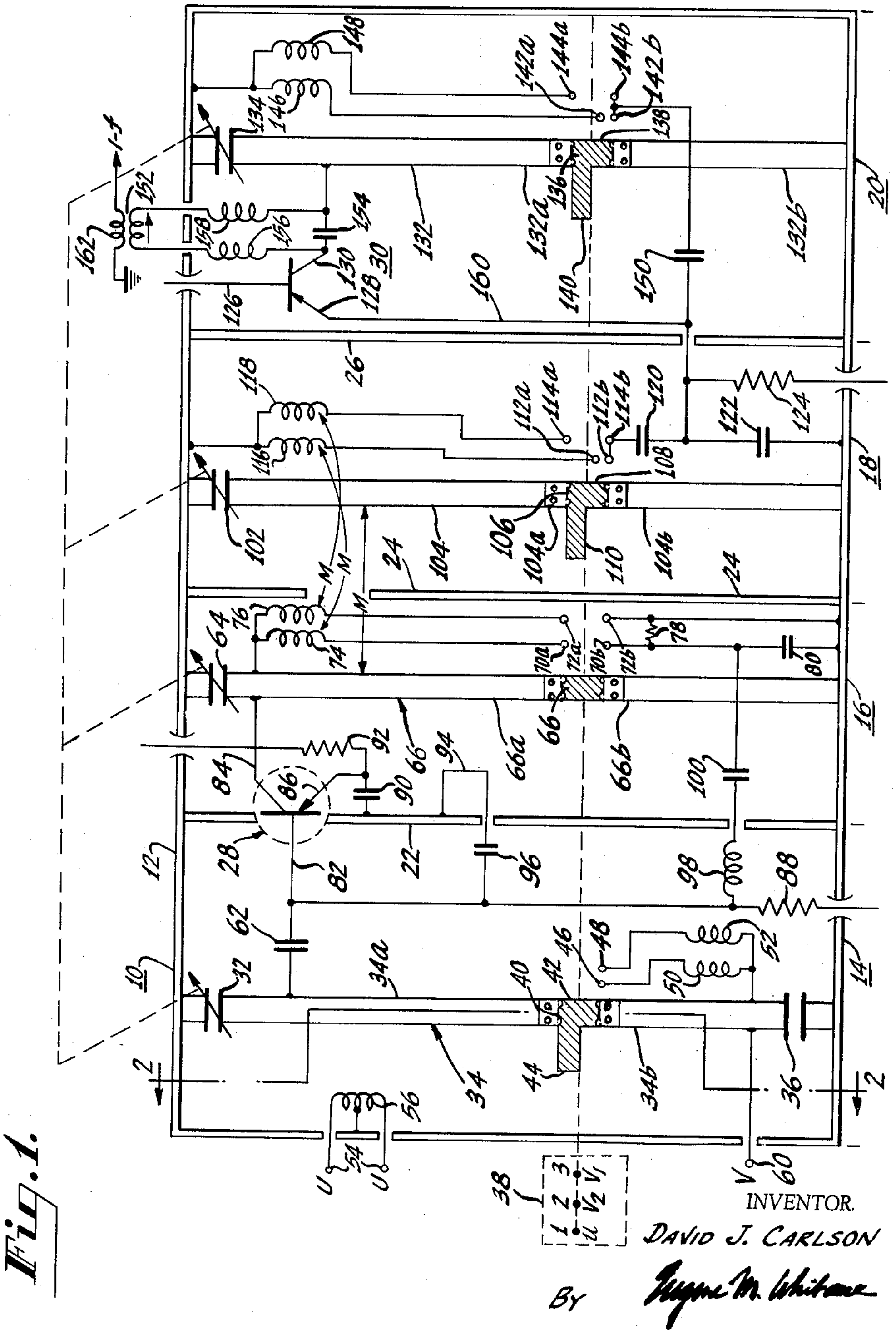
FIGURE 1 is a diagrammatic schematic circuit diagram of a UHF-VHF television tuner embodying one form of the invention.

The all channel television tuner 10 shown in FIGURE 1, includes a conductive chassis 12 which provides a shield enclosure divided into four separate compartments 14, 16, 18 and 20 by three transverse conductive walls 22, 24 and 26. The compartments 14 and 16 respectively, comprise the tunable input and output circuits of an R.F. amplifier stage including a transistor 28, and the compartments 18 and 20 include, respectively, the tunable input circuit for the signal mixer stage and the tunable oscillator circuit. A transistor 30 included in the compartment 20 serves as the active element of the oscillator circuit, and as the mixing or frequency conversion device for the tuner.

The tunable R.F. input or signal selection circuits in the compartment 14 include a variable tuning capacitor 32 which may for example comprise one portion of a parallel plate type ganged tuning capacitor having a fixed stator plate or plates and a rotatable rotor plate or plates. One of the sets of stator and rotor plates of the capacitor 32 is mounted on and conductively connected to the chassis 12, and the other of the sets of plates is conductively connected to a transmission line conductor 34 which extends across the compartment 14 and is connected or coupled to the opposite wall of the compartment through a fixed capacitive element 36. The conductor 34 and the compartment 14 form a tunable transmission line, the function and operation of which will be described subsequently.

The transmission line conductor 34 is formed in two axially aligned portions 34*a* and 34*b*, the adjoining ends of which are separated by a distance sufficient such that, in the absence of a conductive bridging element across the space, the transmission line is ineffective for tuning in the UHF television band.

A three position plunger type switching means 38 is provided for selectively conditioning the all-channel television tuner for tuning in: (1) the UHF or U-television band extending from 470 to 890 mc.; (2) the upper VHF or $V_2$ television band extending from 176 to 216 mc.; or (3) the lower VHF or $V_1$ television band extending from 54 to 88 mc. It is to be understood that any suitable type of switching means may be employed such as for example, a rotary wafer switch or the like. The illustrated switching means includes a movable conductive slide member 40 having a first portion 42 of sufficient width to bridge the gap between the transmission line conductor portions 34*a* and 34*b*, and a tail portion 44 for continuous conductive engagement with only the transmission line conductor portion 34*a*. The switching means also includes a pair of fixed contacts 46 and 48 positioned for sequential engagement with the first portion 42 of the conductive slide member of the switch. A pair of inductors 50 and 52 are respectively connected between the contacts 46 and 48 and the transmission line conductor portion 34*b*. The inductor 50 is selected to tune the variable capacitor 32 for tuning over the $V_2$ television band, and the inductor 52 is selected to tune the tuning capacitor 32 over the $V_1$ television band.

Figure 2:
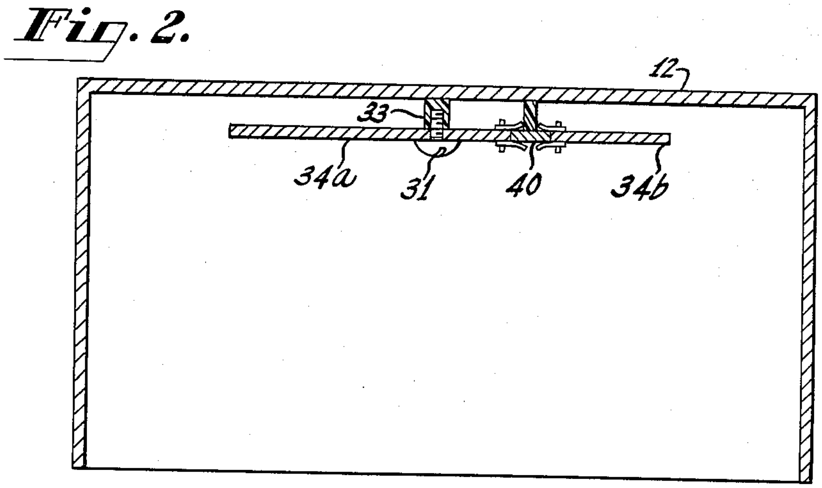
FIGURE 2 is a cross section view taken along line 2—2 in FIGURE 1.
Figure 3:
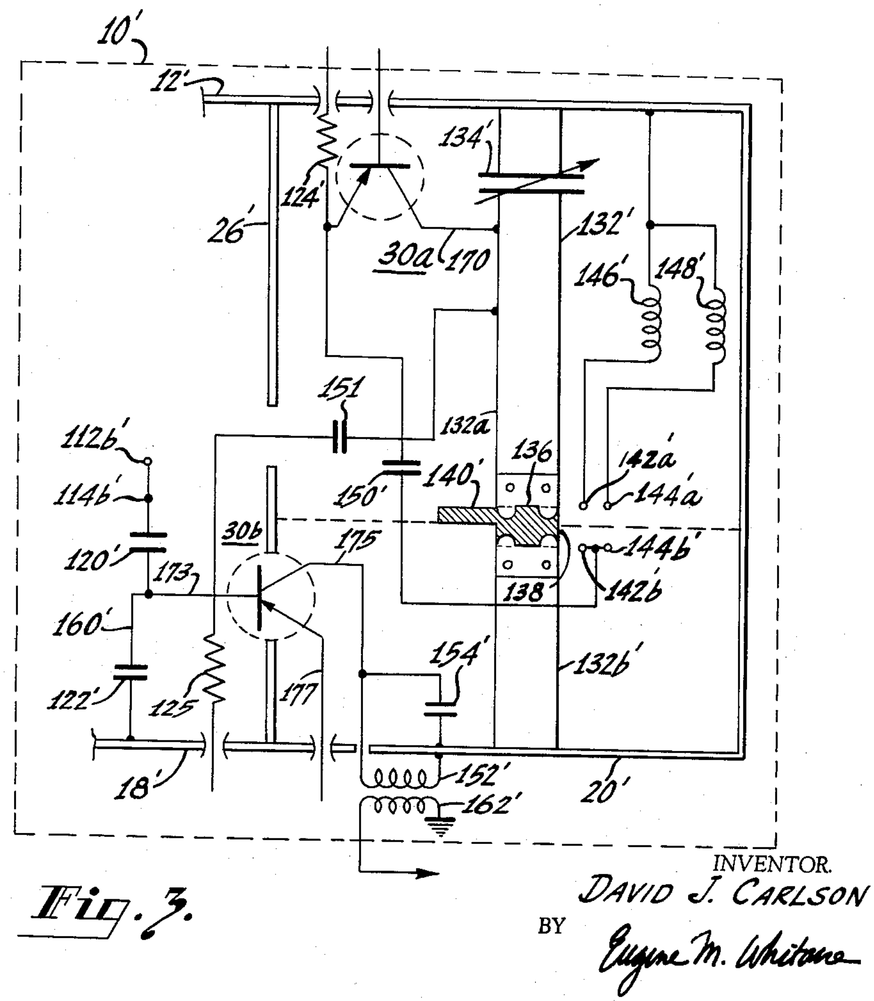
FIGURE 3 is a diagrammatic schematic circuit diagram of a portion of a UHF-VHF television tuner including separate oscillator and mixer transistors.

Referring now to FIGURE 2 there is shown a cross section view of the transmission line conductor 34 and the conductive slide member 40 taken along line 2—2 in FIGURE 1 to explain the operation of the switching circuit means 38 when the switching means 38 is set at position 1. The conductor portion 34*a* and 34*b* have connected to the ends thereof wiper type contacts to hold the conductive slide member 40 in position to make electrical contact with portions 34*a* and 34*b* of the transmission line conductor 34. The insulating spacer 33 and the nylon screw 31 are not shown in FIGURE 1 for the sake of simplicity, but are shown in FIGURE 2 to explain the mounting means of the transmission line conductor 34 on the chassis 12.

Signals from a balanced UHF signal source, such as a UHF television antenna, not shown, are coupled to a pair of UHF signal input terminals 54. Leads from the terminals 54 extend through the conductive chassis 12 into the compartment 14 for connection to opposite ends of an inductive coupling loop 56. The loop 56, at a point intermediate the ends thereof is connected to the chassis 12. Signals from a VHF source, such as a VHF antenna, which have been processed in a manner such that the VHF signals are unbalanced with respect to ground, are applied between a VHF signal input terminal 60 and the chassis 12. A lead from the VHF input terminal 60 extends through an aperture in the chassis 12, and is conductively connected to the transmission line conductor portion 34*b*. Signal energy appearing on the transmission line conductor portion 34*a* is coupled through a coupling capacitor 62 to the input electrode 82 of the R.F. amplifier transistor 28.

With the switching means 38 set in the first or U position, as shown, signal energy applied to the UHF input terminals 54 is coupled through the loop 56 to the transmission line conductor 34. It will be noted that the transmission line conductor portions 34*a* and 34*b* are conductively connected together by the first portion 42 of the switch. To this end it should be noted that the compartment 14 together with the transmission line conductor 34 and the tuning capacitor 32 comprise a capacity end-loaded quarter wave transmission line, the conductor 34 being the "inner conductor" and the walls of the compartment 14 being the "outer conductor" of the transmission line. The relative dimensions and reactance values of the transmission line are selected in accordance with known design techniques to provide tuning by the capacitor 32 over the UHF television band extending from 470 to 890 mc. The relative lengths of the transmission line conductor portions 34*a* and 34*b* are selected such that the discontinuity or break in the transmission line occurs at a relatively low impedance point along the line so that the effect of the switching means on UHF operation is minimized. The coupling capacitor 62 is coupled to a point on the transmission line portion 34*a*, such as to provide substantially optimum coupling from the transmission line to the R.F. amplifier over the entire UHF television band.

In the second or $V_2$ position of the switching means 38, the transmission line conductor portions 34*a* and 34*b* are electrically disconnected, and the contact 46 is connected through the slide member 40 to the transmission line portion 34*a*. Under these conditions, any UHF signals applied to the UHF signal input terminals 54 will be substantially attenuated because the transmission line conductor has been broken. However, signals in the $V_2$ television band are applied to the tunable circuit including the capacitive element 36, the inductor 50 and the tuning capacitor 32. The capacitive element 36 is of a value such as to present negligible impedance to UHF signals but is of sufficient impedance in the VHF television band to provide the proper coupling between the tunable circuit and the VHF signal source. The VHF signals appearing, as described, at the transmission line conductor portion 34*a*, which is the high signal potential side of the $V_1$ tuning circuit, are coupled through the coupling capacitor 62 to the R.F. amplifier transistor 28.

In the third or $V_1$ position of the switching means 38, the conductive slide portion 40 of the switch connects the transmission line conductor portion 34*a* to the contact 48. In this position of the switch the slide portion 40 does not connect with the contact 46 or the transmission line conductor portion 34*b*. Thus the inductor 52, the capacitive element 36 and the tuning capacitor 32 control the tuning of the circuit. Inductor 52, and the capacitive element 36 are proportioned to resonate with the tuning capacitor 32 for tuning over the $V_1$ television band. Again, the selected signals are coupled from the high signal potential side of the tuning capacitor 32 to the R.F. amplifier through the coupling capacitor 62.

The UHF and VHF input signals may be applied simultaneously to the input signal selecting circuit of the tuner 10 without the need for additional switching means. When the switching means 38 is set at position 1, the VHF tuning elements, such as inductors 50 and 52, are disconnected from the tuning capacitor 32. The UHF resonant circuit including the transmission line and the tuning capacitor 32 attenuate the VHF input signals sufficiently to prevent undesirable interaction effects. Similarly, at either positions 2 or 3 of the switching means, the two sections of the transmission line conductor 34 are electrically isolated so that the transmission line is ineffective for tuning in the U-television band, and the resonant circuits for $V_2$ and $V_1$ television bands of operation respectively attenuate any UHF input signals which may be applied to the terminals 54.

Although it is not shown, it is to be understood that the tuning capacitor and the switch may be coupled by suitable mechanical or electrical means so that the variations in the value of the tuning capacitor may automatically set the switching means 38 to the desired position.

The tunable R.F. output circuit in the compartment 16 comprises one portion of a double tuned interstage coupling network between the R.F. amplifier and mixer portions of the tuner. A variable tuning capacitor 64 which may comprise another portion of the parallel plate type ganged tuning capacitor, has one set of plates mounted on the chassis 12, with the other set of plates connected to a transmission line conductor 66 which extends across the compartment 16 and is directly connected to and mounted on the opposite wall of the compartment. The transmission line conductor 66 is formed in two axially aligned portions 66*a* and 66*b* in the same manner as mentioned above with respect to the transmission line conductor portions 34. The conductor 66 and the compartment 16 form another tunable transmission line.

Ganged for control by the plunger type switching means 38 is a conductive slide member 68 positioned to conductively connect the first and second portions 66*a* and 66*b* of the transmission line conductor in the U position of the switch. The switch includes two pairs of fixed contacts 70*a*, 70*b* and 72*a*, 72*b*. A first inductor 74 is connected from the transmission line portion 66*a* to the contact 70*a* and a second inductor 76 is connected between the transmission line conductor portion 66*a* and the contact 72*a*. Contacts 70*b* and 72*b* are connected together by a resistor 78, with the contact 72*b* being directly connected to the chassis 12 and the contact 70*b* being connected to the chassis through a capacitor 80.

With the switching means in the U position, the combination of the transmission line conductor 66, the compartment 16 and the tuning capacitor 64 comprise a capacity end-loaded quarter wave transmission line which is tuned in unison with the circuit in the compartment 14. With the switching means in the $V_2$ or second position, the transmission line conductor portions 66*a* and 66*b* are no longer connected together and the slide member 68 then connects the terminal 70*a* to the terminal 70*b*. Under these conditions, the tuning capacitor 64 together with the inductor 74 and the capacitor 80 provide an output circuit for the R.F. amplifier which is tunable over the $V_2$ television band. In the third or $V_1$ position of the switching means, only the terminals 72*a* and 72*b* are connected together so that the output circuit for the R.F. amplifier includes the inductor 76 and the tuning capacitor 64 which cover the $V_1$ television band.

The R.F. amplifier transistor 28 is mounted in the conductive wall 22 which separates the chassis compartments 14 and 16 in a manner such that the base electrode 82 thereof extends into the compartment 14 and the collector and emitter electrodes 84 and 86 thereof extend into the compartment 16. The transistor 28 may have a conductive casing which is directly or capacitively connected to the wall 22. The base electrode 82 is coupled to the coupling capacitor 62 and receives an appropriate biasing potential from a D.-C. supply circuit (not shown) connected with a resistor 88 which connects to the exterior of the tuner by means of a feedthrough capacitor. The emitter electrode 86 is coupled through a signal bypass capacitor 90 to the compartment wall 22, and is biased through a network including a resistor 92 which is connected to suitable D.-C. circuit means (not shown) through a feedthrough capacitor. The collector electrode 84 is directly connected to the transmission line conductor portion 66*a*.

Neutralization of the R.F. amplifier is effected at UHF by a circuit including inductive loop 94 inductively coupled to the transmission line conductor 66. One end of the loop 94 is at ground potential by connection thereof to the wall 22 and the other end of the loop 94 is connected through a neutralizing capacitor 96 to the base electrode 82. For neutralization of the R.F. amplifier during operation in the $V_2$ and $V_1$ frequency bands, an inductor 98 in the compartment 14 is connected to the base electrode 82, and through an aperture in the wall 22 to a capacitor 100. The other end of the capacitor 100 is connected to the switch contact 70*b*.

The R.F. amplifier of compartments 14 and 16 may be thought of as including a bridge circuit comprising four arms. For example at position 2 of the switching means ($V_2$ band of operation), the four arms of the bridge comprise (1) the inherent capacitance between the collector and base electrodes 84 and 82, respectively, (2) the variable tuning capacitor 64, (3) the fixed capacitor 80, and (4) the VHF neutralizing network. The VHF neutralizing network 98–100 has a frequency of resonance above the $V_2$ frequency range so that the VHF neutralizing network presents an effective capacitive reactance that varies as a function of the change of the frequency of operation and hence as a function of the change of capacitance of the variable tuning capacitor 64 to maintain the bridge balanced as the circuit is tuned.

Inductive tap neutralization is used for operation in the UHF band. The coupling link 94 of the UHF neutralizing network is physically positioned to couple energy from the transmission line conductor 66 to the base electrode 82 of transistor 28 at the proper phase (180° out of phase with the energy fed back from the collector electrode 84 to the base electrode 82 through the intrinsic feedback capacitance) throughout the UHF television band.

Although gain throw-away is utilized for neutralization of the amplifier for operation in the third position of the switch ($V_1$ television band), it is to be understood that the same UHF neutralizing means could be employed, with the proviso that the values of the inductor 98 and the capacitor 100 be designed to cover both the $V_2$ and the $V_1$ television bands.

The second portion of a double tuned interstage coupling network is included in the compartment 18. A variable tuning capacitor 102 which may comprise another portion of the parallel plate type ganged tuning capacitor, has one set of plates mounted on the chassis 12, with the other set of plates connected to a transmission line conductor 104 which extends across the compartment 18 and is directly connected to and mounted on the opposite wall of the compartment. The transmission line conductor 104 is formed in two axially aligned portions 104*a* and 104*b* in the same manner as mentioned above with respect to the transmission line conductors 34 and 66. The conductor 104 and the walls of the compartment 18 form a third tunable transmission line.

Ganged for control by the plunger type switching means 38 is a conductive slide member 106 having a first portion 108 of sufficient width to bridge the gap between the transmission line portions 104*a* and 104*b*, and a tail portion 110 for continuous conductive engagement with only the transmission line conductor portion 104*a*. The switching means also includes two pairs of fixed contact 112*a*–112*b* and 114*a*–114*b* positioned for sequential engagement with the first portion 104*a* of the conductive slide member of the switch. A pair of inductors 116 and 118 are respectively connected between the contacts 112*a* and 114*a* and the wall of the chassis 12. With the switching means in the U or first position the combination of conductor 104, the compartment 18 and the tuning capacitor 102 comprise a capacity end-loaded quarter wave transmission line which is tuned in unison with the circuits in the compartments 14 and 16. With the switching means in the $V_2$ or second position, the transmission line conductor portions 104*a* and 104*b* are no longer connected together and the slide member 68 then connects the terminal 112*a* to the terminal 112*b*. The tail end 110 of the slide member 108 connects the transmission line conductor portion 104*a* to the terminals 112*a* and 112*b*.

An opening in the wall 24 permits inductive coupling between:

(1) transmission line conductor 66 and transmission line conductor 104;

(2) inductor 74 and inductor 116; and (3) inductor 76 and inductor 118.

Terminals 112*b* and 114*b* are connected to each other, and through a capacitor 120 (which has leads extending through an aperture in the wall 26 into the compartment 20) to the self-oscillating mixer device in the compartment 20. The capacitor 122 is coupled through a coupling link 160 to the capacitor 120. Capacitors 120 and 122 form a capacitive voltage divider, and signals developed across the capacitor 122 are coupled to the emitter electrode 128 of the transistor 30.

The active circuit element in the compartment 20 is a transistor 30 having its base electrode 126 biased to a desired D.C. potential by means of a source of D.C. potential (not shown) which is coupled to the transistor through a feedthrough capacitor. The emitter electrode 128 of transistor 30 is biased to a desired D.C. bias potential through a circuit comprising a resistor 124 and a feedthrough capacitor. The resistor 124 is connected to the emitter electrode 128. The collector electrode 130 of transistor 30 is coupled through an I.F. tank circuit to a transmission line conductor 132 which comprises two aligned separate conductor portion 132*a* and 132*b*. The conductor 132 and the walls of the compartment 20 form a fourth tunable transmission line. Transmission line conductor portions 132*a* and 132*b* are separated by sufficient distance so that, in the absence of a conductive bridge element across the space, the transmission line is ineffective for tuning in the UHF television band. Conductor portion 132*a* is connected to a variable capacitor 134. The variable capacitor 134 may comprise another portion of the parallel type ganged tuning capacitor. The capacitor 134 has one set of plates mounted on the chassis 12, with the other set of plates connected to the transmission line conductor 132.

A conductive slide member 136 includes a first portion 138 of sufficient width to bridge the gap between the transmission line conductor portions 132*a* and 132*b*, and a tail portion 140 for continuous conductive engagement with only the transmission line conductor portion 132*a*. The switching means also includes two pairs of fixed contacts 142*a*–142*b* and 144*a*–144*b*, positioned for sequential engagement with the first portion 138 of the conductive slide member of the switch. A pair of inductors 146 and 148 are respectively connected between the chassis 12 and contacts 142*a* and 144*a*. The inductor 146 is selected to tune the variable capacitor 134 over the $V_2$ television band, and the inductor 148 is selected to tune the tuning capacitor 134 over the $V_1$ television band.

Contacts 142*a* and 144*b* are connected to each other and are coupled through capacitor 150 to the emitter electrode 128 of transistor 30. The I.F. tank circuit comprises an I.F. coil 152 and a capacitor 154. UHF isolating inductors 156 and 158 are connected in a series circuit with the I.F. coil 152, and this series circuit is connected across the capacitor 154. An inductor 162 is inductively coupled to the I.F. coil 152 to derive the intermediate frequency output signal of the tuner circuit 10.

When the switching means is set in position 1 as shown in FIGURE 1, which corresponds to the U-television band position, UHF signals appearing on the interstage transmission line conductor are inductively coupled to the emitter electrode 128 of the transistor 30 by means of the coupling link 160. The signals coupled to the emitter electrode 128 of the transistor 30 are developed across the capacitor 122. The transistor 30 oscillates at a frequency determined by the setting of the variable capacitor 134 in combination with the transmission line, the capacitor 154 in the I.F. tank circuit, and the output capacitance of the transistor 30.

When the switching means is respectively set at positions $V_2$ and $V_1$, the inductors 146 and 148 respectively determine (in conjunction with the variable capacitor 134, the capacitor 154 and the output capacitance of the transistor 30) the frequency of oscillation of the converter circuit in the compartment 20. VHF signals are coupled from inductors 74 and 76 to inductors 116 and 118, respectively through the opening in the wall 24 as previously explained. The first portion 108 of the sliding member 106 connects the capacitor 120 to the coils 116 and 118 respectively, thereby coupling the VHF signals directly to the emitter electrode 128 of the transistor 30.

The transistor 30 has inherent capacitance between its collector electrode 130 and its emitter electrode 128 providing a feedback path for energy tending to sustain oscillations in the circuit. The value of the inherent capacitance of the transistor 30 is such that it provides enough feedback energy at UHF to cause self-oscillation, but the value of inherent feedback capacitance is too small to permit enough energy to be fed back to sustain oscillations at VHF television range. The capacitor 150, which is coupled between the emitter electrode 128 of transistor 30 and the inductors 146 and 148 when the portion 138 of the sliding member 136 is connected between the sets of contacts 142*a*–142*b*, and 144*a*–144*b* respectively, adds sufficient capacitance to the inherent capacitance of the transistor 30 to permit enough feedback energy to cause oscillations at VHF.

In operation, when the switching means is set in position 1 (U-television band) UHF and VHF input signals are coupled to the input signal selecting circuit in the compartment 14, as previously described. The conductive slide members 40, 68, 106 and 136 connect transmission line conductors 34*a*, 66*a*, 106*a* and 132*a* to transmission line conductors 34*b*, 66*b*, 106*b* and 136*b* respectively, so that transmission line conductors 34, 66, 104 and 132 form with compartments 14, 16, 18 and 20 a section of a quarter wavelength transmission line respectively. The input signal selecting circuit is tuned at the desired frequency by means of the tuning capacitor 32 and the transmission line in the compartment 14 which form the UHF resonant circuit. The VHF input signals applied are attenuated by the VHF resonant circuit.

UHF signals are coupled through coupling capacitor 62 to the input circuit of the R.F. amplifier stage (the base electrode 82 of transistor 28) to be amplified. The output circuit of the R.F. amplifier stage is tuned at the desired frequency by means of the tuning capacitors 64 and 102 and the transmission lines of the compartments 16 and 18 respectively. The UHF signals are inductively coupled through an opening in the wall 24 between transmission line conductor 66 and transmission line conductor 104.

The transmission line conductor 104 is inductively coupled to the coupling link 160 which is part of the input circuit of the converter stage in the compartment 20. The UHF signals coupled from the R.F. amplifier stage to the converter stage are mixed in the converter stage with the signals having the frequency of self-oscillation of the converter circuit.

The local oscillator frequency is determined by the transmission line in the compartment 20 and the tuning capacitor 134. The inherent capacitance between the collector and emitter electrodes of transistor 30 provides the feedback path for the energy to cause oscillations. The I.F. tank circuit in the collector electrode circuit of the transistor 30 develops the desired intermediate frequency output signal.

When the switching means is set at position 2 ($V_2$ television band) the conductive slide members 40, 106 and 136 couple sections 34*a*, 104*a* and 132*a* of the respective transmission line conductors to the inductors 46, 116 and 146 to tune the circuits in the $V_2$ band. Transmission line conductors 34*b*, 104*b*, and 132*b* are then disconnected from their corresponding sections 34*a*, 104*a* and 132*a* respectively. Conductive slide member 68, on the other hand, disconnects section 66*a* and section 66*b*, of transmission line conductor 66, from each other, and connects inductor 74 to the fixed capacitor 80, to provide tuning of the circuit in compartment 16 in the $V_2$ band by means of inductor 74 and tuning capacitor 64.

When each of the transmission line conductors in compartments 14, 16, 18 and 20 are electrically divided in two separate sections the corresponding transmission line is ineffective for tuning in the UHF band.

The VHF signals are coupled from the input signal selecting compartment 14 to the R.F. amplifier stage by means of coupling capacitor 62. The VHF signals are coupled from the compartment 16 to the compartment 18 through the opening in the wall 24 by means of the inductive coupling between inductors 74 and 116.

The inductor 116 is connected to the capacitor 120 by the conductive slide member 106 to couple the VHF signals to the converter stage in compartment 20.

The conductive slide member 136 connects the inductor 146 to the feedback capacitor 150 and to the transmission line conductor section 132*a* (as previously explained). The capacitor 150 provides another feedback path for the additional energy needed to cause oscillations at VHF.

The operation of the tuner 10, when the switching means 38 is set in the position 3, is similar to the operation of the tuner 10 when the switching means is set in its position 2, except that the conductive slide members of the switching means 38 select an inductor in each of the four compartments of the tuner having a value of inductance for tuning in the $V_1$ television band.

Since a single tuning control element is used to tune over the UHF and both VHF bands, it will be understood that the problem of providing suitable tuning indicator means is considerably reduced. For example, the tuning dial may be provided with three concentric scales corresponding respectively to the three bands to be tuned. Other mechanical and electrical details for providing a simple and efficient tuning indicator for use with a tuner embodying the invention will be apparent to persons skilled in the art.

An alternate converter stage, for a tuner similar to the one shown in FIGURE 1, comprises two active elements for the self-oscillating-mixing-I.F. amplifying functions of the active element in the converter stage of the tuner 10, as shown in FIGURE 2 of the drawings.

The tuner 10′, which may be substantially identical in the signal selecting circuit and the tuned interstates to that of the tuner 10, shown in FIGURE 1, comprises a converter stage having transistors *30a* and *30b* which respectively have the functions of (1) local oscillator, and (2) mixer-I.F. amplifier in the converter stage of compartment 20′. Similar circuit elements in both tuners 10 and 10′ have the same numerals, with the exception that the circuit elements in tuner 10′ are identified by prime numbers, for example, the transmission line conductor of the converter in tuner 10′ (which corresponds to the transmission line conductor 132) is identified by the number 132′.

The collector electrode 170 of the transistor *30a* is directly connected to the transmission line conductor portion *132a′*. The tuning circuit means for the local oscillator stage of the converter in the compartment 20′ are identical to the tuning circuit means of the converter in the compartment 30 and operate in a similar manner as previously described in connection with FIGURE 1 of the drawings. A capacitor 151, however, couples the base electrode 173 of transistor *30b* and the transmission line conductor 132′ for coupling the local-oscillator-frequency signal to the mixer stage of the converter. UHF and VHF signals are coupled from the tuned interstage to the converter stage (base electrode 173 of transistor *30b*) of the tuner 10′, in a manner similar to that described in connection with the tuner 10, shown in FIGURE 1. The collector electrode 175 of the transistor *30b* is connected directly to an I.F. tank circuit comprising an inductor 152′ and a capacitor 154′ connected in parallel between the collector electrode 175 and the chassis 12′. An inductor 162′, inductively coupled to the I.F. inductor 152′, provides the intermediate frequency output of the tuner 10′. The transistor *30b* is mounted on the wall 26′ between the compartment 18′ and 20′ so that its base electrode 123 extends in compartment 18′, and its collector electrode 175 and emitter electrode 177 extend in the compartment 20′. The method for selecting the frequency of oscillation of the transistor *30a* is the same as the one described in connection with the single active element converter stage 20 of the tuner 10 shown in FIGURE 1.

It is to be understood that although the principles of the invention are shown as applied to a converter stage, either with a single or a double active element, the same principles are applicable to an oscillator circuit alone.

What I claim is:

1. A high frequency tuner comprising a transmission line including a continuous outer conductor and an inner conductor having first and second electrically isolated portions, tuning means connected with said transmission line, and switching means selectively operable to electrically connect said first and second conductor portions to provide a second continuous conductor so that said tuning means is effective to tune said transmission line over a range of frequencies, and to electrically disconnect said first and second conductor portions so that said tuning means is ineffective to tune said transmission line over said range of frequencies.

2. A high frequency tuner comprising a transmission line having inner and outer conductors said inner conductor including first and second electrically isolated portions, a variable capacitor connected between said first conductor portion and said outer conductor, and switching means selectively operable to connect said first and second inner conductor portions together so that said capacitor is effective to tune said transmission line over a range of frequencies and to disconnect said first and second inner conductor portions so that said capacitor is ineffective to tune said transmission line over said range of frequencies.

3. A high frequency tuner comprising a transmission line having inner and outer conductors, said inner conductor including first and second electrically isolated portions, a variable capacitor coupled between said first conductor portion and said outer conductor, an inductor, and switching means selectively operable in one state to couple said first and second inner conductor portions together so that said capacitor is effective to tune said transmission line over a first range of frequencies, and in another state to couple said inductor to said capacitor so that said capacitor is effective to tune said inductor over a second range of frequencies.

4. A multi-band tuner comprising a transmission line having inner and outer conductors, said inner conductor having first and second electrically isolated portions, a variable capacitor connected between said first conductor portion and said outer conductor, input circuit means for signals in a first frequency band coupled to said first inner conductor portion, input circuit means for signals in a second frequency band coupled to said second inner conductor portion, output circuit means coupled to said first conductor portion, an inductor, and switching means selectively operable in one state to couple said first and second inner conductor portions together so that said capacitor is effective to tune said transmission line over a range of frequencies in said first frequency band, and in another state to couple said inductor to said capacitor so that said capacitor is effective to tune said inductor over a range of frequencies in said second frequency band.

5. In combination:

a conductive chassis, a transmission line conductor mounted on said chassis to form therewith a concentric transmission line, said transmission line conductor comprising two separate axially aligned but spaced portions, a variable tuning capacitor connected between said chassis and said transmission line conductor to tune said transmission line in a first range of frequencies, an inductor, having a value to tune said variable capacitor in a second range of frequencies, and switching means having first and second positions, said switching means in the first position thereof electrically connecting together said transmission line conductor portions, whereby said capacitor is operative to tune said transmission line over a first range of frequencies, and said switching means in the second position thereof operative to couple said inductor to said tuning capacitor whereby said capacitor is operative to tune said inductor over a second different range of frequencies.

6. A UHF-VHF tuner comprising:

an R.F. amplifier stage and a converter stage, said R.F. amplifier comprising a tunable input circuit and a double tuned output circuit, said output circuit of said R.F. amplifier being coupled to the input of said converter, separate means for applying VHF and UHF input signals to said tunable input stage of said amplifier, said input and output stages of said amplifier and said converter stage each comprising a transmission line and an inductor, each transmission line comprising two separate axially aligned sections separated at the low impedance point of the line, and switching circuit means for coupling each of said inductors to one of said two sections of the corresponding transmission line when said tuner is set for VHF operation, and for coupling said two sections of each of said transmission lines to each other when said tuner is set for UHF operation.

7. An all channel television tuner enclosed in a conductive chassis having conductive wall portions to form with said conductive chassis a plurality of compartments, comprising, an R.F. amplifier stage including a transistor having base, emitter and collector electrodes, and having inherent capacitance between said base and collector electrodes, said amplifier stage having a tunable input circuit coupled between said base electrode and a point of reference potential, said tunable input circuit being enclosed in one of said compartments, said input circuit including switchable reactive circuit means to tune said input circuit at different frequencies in both UHF and VHF television bands, said reactive circuit means comprising a transmission line conductor having two separate axially aligned sections and a plurality of inductors, said transmission line conductor and its corresponding compartment forming a section of a transmission line, said transmission line and said inductors being tunable at a desired frequency by a variable capacitor connected between said transmission line conductor and said point of reference potential, separate input circuit means for coupling UHF and VHF input signals to said transmission line respectively, switching circuit means having positions representing frequency bands, said switching circuit means including a conductive slide member coupled to said two transmission line sections during UHF operation, said conductive slide member being coupled to a selected one of said plurality of inductors and to only one of said sections of said transmission line during VHF operation, said R.F. amplifier stage having a double tuned output circuit enclosed in two of said compartments having an opening in the wall separating said compartments to provide inductive coupling between said compartments, said output circuit being coupled to said collector electrode of said transistor, said output circuit comprising a plurality of transmission line conductors inductively coupled with each other and a plurality of inductors, each of said transmission line conductors also having two separate aligned sections each forming with its corresponding compartment a section of a transmission line, said transmission lines being tuned by variable capacitors ganged with said variable capacitor of said input circuit respectively, a plurality of conductive slide members each being ganged with said conductive slide member of said R.F. amplifier input circuit to couple said two sections of each of said transmission line conductors respectively during UHF operation, and to couple a selected one of said plurality of inductors to one of said two sections of its corresponding transmission line conductor during VHF operation, UHF neutralizing means coupled between said output circuit and said input circuit to feed back energy 180° out of phase with the energy fed back through said inherent capacitance, said UHF neutralizing means including a coupling link and a fixed capacitor connected in series between said base electrode and a point of reference potential, and VHF neutralizing means including a series circuit comprising a capacitor and an inductor connected in series with each other, said series circuit being coupled between said base electrode of said transistor and one of said inductors during said VHF operation, said UHF neutralizing means having a negligible effect during said VHF operation whereby the neutralizing energy is fed back almost entirely by said series circuit during said VHF operation.

8. A multi-band tuner comprising:

a conductive chassis, a signal selecting input circuit, a tuned interstage, and a converter stage enclosed in said conductive chassis, a plurality of portions of conductive walls forming with said chassis a plurality of compartments each corresponding to a different one of said input circuit and said stages, each of said compartments enclosing a variable capacitor, a transmission line conductor having two separate aligned sections and a plurality of inductors, said transmission line conductors and said compartments forming sections of transmission lines respectively, said variable capacitors being coupled to said transmission lines to tune said transmission lines to a frequency in a first frequency range, each of said capacitors being ganged to each other, each one of said inductors having a value such that the capacitance range of said variable capacitors resonates with each one of said inductors in a second and different frequency range, switching means, having a plurality of positions each representing a different frequency range, for sequentially selecting one of said inductors to tune said variable capacitor in the desired frequency range, said switching means comprising conductive switch elements coupled to said two sections of said transmission lines to complete said transmission lines when said switching means is in the position corresponding to said first frequency range, said switch elements being coupled to only one of said two sections of said transmission line and to a desired inductor in each of said stages when said switching means is set at any other position, and separate input circuit means for coupling VHF and UHF input signals to said signal selecting input circuit respectively.

9. A converter circuit comprising:

first and second active devices each having input and output electrodes, and each having intrinsic capacitance between said input and output electrodes, tunable circuit means for controlling the frequency of oscillation of said first active device comprising a concentric transmission line having first and second transmission line conductors, a variable capacitor and an inductor, said first transmission line conductor having two separate axially aligned portions, said variable capacitor being connected to said first transmission line conductor to tune said transmission line to a desired frequency in a first range of frequencies, switching circuit means having first and second positions corresponding respectively to said first range of frequencies and to a second range of frequencies, and having a conductive slide member for selecting the frequency of oscillation of said converter, said conductive slide member coupling said two portions of said first transmission line conductor to form with said second transmission line conductor a section of a transmission line when said switching means is set in said first position, and to couple one of said portions of said first transmission line conductor to said inductor when said switching means is set in said second position, said intrinsic capacitance providing a feedback path for energy to cause oscillations of said first active device when said switching means is set at said first position, a feedback capacitor connected to the input electrode of said first active device, said conductive slide member coupling said feedback capacitor to said inductor when said switching means is set in said second position to decrease the capacitive reactance in the feedback path to couple back sufficient energy to sustain oscillations at said second range of frequencies, a coupling capacitor connected between said first transmission line conductor and the input electrode of said second active device to couple signals having the frequency of oscillation of said first active device to said second active device, input circuit means for coupling input signals to said input electrode of said second active device, so that said second active device mixes said input signals and said signals having said frequency of oscillation, and an I.F. tank circuit having an I.F. resonant frequency to provide an I.F. signal output.

10. A multi-band tuning circuit comprising:

a resonant transmission line including a pair of conductors, at least one of said conductors comprising first and second electrically isolated conductor portions, a tuning element coupled to said transmission line, reactance means, and switching means having first and second conditions of operation, said switching means in said first condition connecting together said first and second conductor portions whereby said tuning element is effective to tune said transmission line over a first range of frequencies, said switching means in said second condition operable to connect said reactance means into said tuning circuit in such a manner that said tuning element is effective to tune said reactance means over a second range of frequencies.

11. A tunable circuit comprising:

a conductive chassis to provide a shielding enclosure for said tunable circuit, a transmission line conductor and a variable capacitor both mounted on said chassis to provide a section of a capacitive end loaded quarter-wavelength transmission line, said transmission line conductor comprising first and second axially aligned separate sections having a gap in between said sections to prevent effective tuning of said tunable circuit in a first frequency range in the absence of a conductive bridge between said sections, an inductor coupled to said second section of said transmission line conductor, said inductor being resonant with said variable capacitor in a second frequency range, first input circuit means inductively coupled to said first section of said transmission line for applying signals of said first frequency range to said tunable circuit, a fixed capacitor connected between said second section of said transmission line and said chassis, second input circuit means connected to said fixed capacitor for applying signals of said second frequency range to said tunable circuit, and switching circuit means having different positions corresponding to said first and second frequencies, said switching circuit means including a slide conductive member having first and second portions, said first portion having the width of said gap between said first and second transmission line conductor sections to complete said transmission line conductor when said first portion of said slide member makes contact with said first and second sections, said second section having a width smaller than the width of said first portion so that the slide conductive member is always in contact with said first transmission line conductor section, whereby when said switching means is set at a position corresponding to said first frequency range said first portion of said conductive slide member is in contact with said first and second sections of said transmission line conductor, and when said switching circuit means is set at a position corresponding to said second frequency range said first portion of said conductive slide member is in contact with said inductor, and said second portion of said conductive slide member is in contact with said first section of said transmission line conductor to couple said inductor to said variable capacitor through said first section of said transmission line conductor.

12. An R.F. amplifier stage enclosed in a conductive chassis to provide a shielding enclosure, including, a transmission line conductor and a variable capacitor both mounted on said chassis to provide a section of a capacitive end loaded quarter-wavelength transmission line, said transmission line conductor comprising first and second axially aligned separate portions having a gap in between said sections to prevent effective tuning of said tunable circuit in a first frequency range in the absence of a conductive bridge between said sections, an inductor coupled to said variable capacitor, said inductor of a value to resonate with said variable capacitor in a second frequency range, an amplifier device having input, output and common electrodes, and having feedback capacitance between said input and output electrodes, means for coupling said first portion of said transmission line conductor to said output electrode of said amplifier device, means connected to said input electrode for applying thereto signals of said first and second frequency ranges, switching circuit means having first and second positions corresponding to said first and second frequency ranges, said switching circuit means including a slide conductive member having a width equal to said gap between said first and second transmission line conductor portions to complete said transmission line conductor when said slide member makes contact with said first and second portions when said switching circuit means is set in said first position, a fixed capacitor coupled to said chassis, said capacitor being coupled to said inductor through said slide conductive member when said switching circuit means is set in said second position, first neutralizing circuit means for signals of said first frequency range connected between said chassis and said input electrode, said neutralizing means including a coupling link and having negligible effect at said second frequency range, and second neutralizing circuit means including a capacitor and an inductor, for signals of said second frequency range coupled between said fixed capacitor and said input electrode of said amplifier device so that when said switching means is set in said second position said inductor and said second neutralizing means are coupled between said input and said output electrodes.

13. A multi-band tuning circuit comprising:

a resonant transmission line including a pair of conductors, at least one of said conductors comprising first and second electrically insulated conductor portions, a tuning element coupled to said transmission line, reactance means, switching means having first and second conditions of operation, said switching means in said first condition connecting together said first and second conductor portions whereby said tuning element is effective to tune said transmission line over a first range of frequencies, said switching means in said second condition coupling said reactance means to said tuning element whereby said tuning element is effective to tune said reactance element over a second range of frequencies, and first and second input circuit means for simultaneously coupling input signals of said first and second ranges of frequencies to said transmission line, said first input circuit means including a coupling link inductively coupled to said transmission line, said second input circuit means including a capacitor connected to one of said conductors, said capacitor having a relatively small capacitive reactance at said first frequency range and a relatively large capacitive reactance at said second frequency range.

14. A VHF-UHF tuner comprising:

a signal selecting input circuit, a tuned interstage, and a converter stage, said input circuit and each of said stages including a variable capacitor, a concentric transmission line having two conductors, at least one of said conductors comprising two separate sections axially aligned and an inductor, each of said variable capacitors being coupled to the corresponding transmission line and being ganged to each other, each of said inductors having an inductance value to tune the corresponding variable capacitor in the VHF television band, each of transmission lines being tunable by the corresponding variable capacitor in the UHF television band, and switching means having a plurality of positions for selecting the frequency band of operation of said tuner, said switching means comprising a conductive switch element in each of said input circuit and tuner stages, said conductive switch elements electrically connecting said two sections of each of said transmission line conductors together to enable tuning of said tuner in the UHF television band, said conductive switch element coupling said inductors to one of said two sections of its corresponding transmission line conductor to enable tuning of said tuner in said VHF television band.

15. In combination:

a conductive chassis, a transmission line conductor mounted on said chassis to form a concentric transmission line with said chassis, said transmission line conductor comprising two separate axially aligned portions insulated from each other, a variable tuning capacitor connected between said chassis and said transmission line conductor to tune said transmission line in a first range of frequencies, an inductor having a value to tune said variable capacitor in a second range of frequencies connected to said chassis, and switching means having positions representing said first and second frequency ranges, said switching means comprising a conductive switch element to electrically connect said transmission line conductor portions when said switching means is set in a position corresponding to said first frequency range, and to couple said inductor to said tuning capacitor through one of said portions of transmission line conductor when said switching means is set in a position corresponding to said second frequency range.

16. In an all channel television tuner the combination comprising:

an R.F. amplifier stage including an active device having input, output and common electrodes, and having inherent capacitance between said input and output electrodes, said amplifier stage having a tunable input circuit coupled between said input electrode and a point of reference potential, said input circuit including a switchable reactive circuit means to tune said input circuit to said television channels, said reactive circuit means comprising an end-loaded transmission line comprising two conductors at least one of said conductors having two separate axially aligned portions and an inductor, said transmission line and said inductor being tunable to different channels by a variable capacitor connected between said transmission line and said point of reference potential, input circuit means for applying UHF and VHF input signals to said transmission line, switching circuit means including a conductive slide member to connect said two portions of said transmission line conductor during UHF operation, and to couple said inductor to one of said two portions of said transmission line conductor during VHF operation, said R.F. amplifier stage having an output circuit coupled to said output electrode of said active device, said output circuit comprising a transmission line including a variable capacitor and an inductor, said transmission line having two conductors, at least one of said conductors including two separate portions axially aligned, said variable capacitor being ganged with said variable capacitor of said input circuit and being connected to one of said two portions of one of said two transmission line conductors, a conductive slide member being ganged with said a conductive slide member of said R.F. amplifier input circuit electrically connected to couple said two portions of said transmission line conductor to each other during UHF operation and to couple said inductors to one of said two portions of said transmission line conductor during VHF operation, UHF neutralizing means coupled between the other of said two conductors of said transmission line in said output circuit and said input electrode of said active device and including a coupling link and a capacitor, said UHF neutralizing means having a negligible effect during VHF operation, VHF neutralizing means including a capacitor and an inductor connected to said input electrode of said active device, and circuit means for coupling said neutralizing means to said other conductor of said transmission line in said output circuit including a fixed capacitor, whereby during VHF operation said conductive slide members couples said VHF neutralizing means to said inductor.

References Cited by the Examiner

UNITED STATES PATENTS

| | | | |
|---|---|---|---|
| 2,772,355 | 11/1956 | Deutsch et al. | 333—82 X |
| 2,894,225 | 7/1959 | Myers | 338—82 |

ROBERT H. ROSE, *Primary Examiner.*

R. F. ROTELLA, R. LINN, *Assistant Examiners.*